(12) United States Patent
An

(10) Patent No.: US 11,818,913 B2
(45) Date of Patent: Nov. 14, 2023

(54) ORGANIC LIGHT EMITTING DIODE (OLED) DISPLAY HAVING SEALANT FORMED OVER SEALING STRUCTURE FORMED BY A FIRST METAL LAYER, AN INSULATING LAYER AND A SECOND METAL LAYER

(71) Applicant: SAMSUNG DISPLAY CO., LTD., Yongin-si (KR)

(72) Inventor: Junyong An, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 17/739,846

(22) Filed: May 9, 2022

(65) Prior Publication Data

US 2022/0263044 A1    Aug. 18, 2022

Related U.S. Application Data

(60) Continuation of application No. 16/121,521, filed on Sep. 4, 2018, now Pat. No. 11,329,248, which is a
(Continued)

(30) Foreign Application Priority Data

Jul. 13, 2015 (KR) ......................... 10-2015-0099222

(51) Int. Cl.
   *H01L 51/52* (2006.01)
   *H10K 50/842* (2023.01)
   (Continued)

(52) U.S. Cl.
   CPC ......... *H10K 50/8426* (2023.02); *H10K 71/00* (2023.02); *H10K 59/12* (2023.02)

(58) Field of Classification Search
   CPC ........................... H10K 50/8426; H10K 59/10
   See application file for complete search history.

(56) References Cited

U.S. PATENT DOCUMENTS

2010/0011566 A1   1/2010  Kim et al.
2014/0028582 A1   1/2014  Chol
(Continued)

FOREIGN PATENT DOCUMENTS

CN          104253241 A   12/2014
KR   10-2010-0009208 A    1/2010
(Continued)

*Primary Examiner* — Anh D Mai
(74) *Attorney, Agent, or Firm* — Lewis Roca Rothgerber Christie LLP

(57) ABSTRACT

An organic light-emitting diode (OLED) display and a method of manufacturing the same are disclosed. In one aspect, the display includes a lower substrate with a display area and a peripheral area surrounding the display area, an upper substrate facing the lower substrate and a display unit disposed on the display area. The display also includes a sealant disposed on the peripheral area and sealing the lower and upper substrates and a first metal layer interposed between the lower substrate and the sealant. The first metal layer includes a plurality of first through-portions extending in a first direction and arranged in a second direction crossing the first direction. The display also includes a second metal layer disposed on the first metal layer and comprising a plurality of second through-portions respectively corresponding to the first through-portions.

15 Claims, 10 Drawing Sheets

Related U.S. Application Data division of application No. 15/147,677, filed on May 5, 2016, now Pat. No. 10,096,794.

(51) Int. Cl.
*H10K 71/00* (2023.01)
*H10K 59/12* (2023.01)

(56) References Cited

U.S. PATENT DOCUMENTS

| | | |
|---|---|---|
| 2015/0001501 A1 | 1/2015 | Cho et al. |
| 2015/0021573 A1 | 1/2015 | Kwak |
| 2015/0060789 A1 | 3/2015 | Cho et al. |
| 2015/0060790 A1 | 3/2015 | Kim et al. |
| 2015/0084498 A1 | 3/2015 | Choi |
| 2015/0102293 A1 | 4/2015 | Cho et al. |
| 2015/0102295 A1 | 4/2015 | Hong |
| 2015/0108438 A1 | 4/2015 | Kim |
| 2015/0243705 A1 | 8/2015 | Kim |
| 2015/0311472 A1 | 10/2015 | Hong |
| 2016/0164027 A1 | 6/2016 | Jeon |
| 2016/0343792 A1 | 11/2016 | Jang |
| 2016/0343974 A1 | 11/2016 | Jang |

FOREIGN PATENT DOCUMENTS

| | | |
|---|---|---|
| KR | 10-2014-0013482 A | 2/2014 |
| KR | 10-2015-0011081 A | 1/2015 |
| KR | 10-2015-0025916 A | 3/2015 |
| KR | 10-2015-0037301 A | 4/2015 |

ORGANIC LIGHT EMITTING DIODE (OLED) DISPLAY HAVING SEALANT FORMED OVER SEALING STRUCTURE FORMED BY A FIRST METAL LAYER, AN INSULATING LAYER AND A SECOND METAL LAYER

CROSS-REFERENCE TO RELATED APPLICATIONS

This application is a continuation of U.S. patent application Ser. No. 16/121,521, filed Sep. 4, 2018, which is a divisional of U.S. patent application Ser. No. 15/147,677, filed May 5, 2016, now U.S. Pat. No. 10,096,794, which claims priority to and the benefit of Korean Patent Application No. 10-2015-0099222, filed Jul. 13, 2015, the entire content of all of which is incorporated herein by reference.

BACKGROUND

Field

The described technology generally relates to an organic light-emitting diode display and a method of manufacturing the same.

Description of the Related Technology

Organic light-emitting diode (OLED) displays are spotlighted as next-generation displays because of their favorable characteristics such as wide viewing angles, high contrast ratio, and rapid refresh rates.

In general, an OLED display has a matrix of pixel circuits that include thin-film transistors (TFTs) and OLEDs and are formed on a substrate. OLED technology is used for small devices such as mobile phones and larger devices such as TVs.

An OLED display includes a lower substrate, an upper substrate, and an interposed display unit. The lower and upper substrates are caused to be adhered to each other with a sealant that is formed along an outer edge of the display unit, and thus, the display unit is sealed from environmental contamination.

Due to recent market-driven trends for a larger and higher definition screen, attempts are being made to reduce dead (non-light-emitting) space that is formed around the display unit.

Information disclosed in this Background section was already known to the inventors before achieving the described technology or is technical information acquired in the process of achieving the described technology. Therefore, it may contain information that does not constitute the prior art that is already known to the public in this country.

SUMMARY OF CERTAIN INVENTIVE ASPECTS

One inventive aspect relates to an OLED display having a structure that can rapidly dissipate static electricity and a method of manufacturing the OLED display.

Another aspect is an OLED display that can prevent damage to a display circuit unit and poor adhesion between a lower substrate and a sealing member and a method of manufacturing the OLED display.

Another aspect is an OLED display that includes: a lower substrate including a display area and a peripheral area that surrounds the display area; an upper substrate facing the lower substrate; a display unit disposed on the display area of the lower substrate; a sealing member disposed on the peripheral area of the lower substrate and adhering the lower substrate and the upper substrate to each other; a first metal layer disposed between the lower substrate and the sealing member and including a plurality of first through-portions that extend in a first direction and are arranged in a second direction that is perpendicular to the first direction; a second metal layer disposed on the first metal layer and including a plurality of second through-portions that have sizes equal to or greater than sizes of the plurality of first through-portions; and connecting portions electrically connecting the first metal layer and the second metal layer to each other.

The OLED display may further include a barrier layer disposed between the lower substrate and the first metal layer, wherein an opening portion on which at least a part of the lower substrate or the barrier layer is exposed through the plurality of first through-portions and the plurality of second through-portions is formed.

The OLED display may further include a first insulating film disposed between the first metal layer and the second metal layer, wherein the first insulating film covers a part of the opening portion and includes a plurality of first fine holes formed in the opening portion.

At least a part of the lower substrate or the barrier layer may be exposed through the plurality of first fine holes.

A sealing member may be filled in the plurality of first fine holes.

The OLED display may further include a second insulating film disposed on the second metal layer, wherein the second insulating film covers a part of the opening portion and includes a plurality of second fine holes formed in the opening portion.

At least a part of the lower substrate or the barrier layer may be exposed through the plurality of second fine holes.

A sealing member may be filled in the plurality of second fine holes.

The plurality of second fine holes may be formed to correspond in position to the plurality of first fine holes.

The second metal layer and the connecting portions may include the same material.

The first metal layer may have an electric resistance that is greater than an electric resistance of the second metal layer.

The plurality of first through-portions and the plurality of second through-portions may be formed to have stripe shapes with long sides and short sides and extend in the first direction.

The plurality of first through-portions and the plurality of second through-portions may be alternately formed in the first direction and the second direction.

The connecting portions may be formed along first edge portions that extend in the second direction along an edge of the lower substrate and along second edge portions that extend in the second direction from the display unit.

The connecting portions may be formed between the plurality of first through-portions and the plurality of second through-portions.

The connecting portions may be formed between opening portions.

The display unit may include a thin-film transistor (TFT) including a semiconductor layer, a gate electrode, a source electrode, and a drain electrode, wherein the first metal layer is disposed on the same layer as the gate electrode, and the second metal layer is disposed on the same layer as the source electrode and the drain electrode.

Another aspect is a method of manufacturing an OLED display that includes: preparing a lower substrate including a display area and a peripheral area that surrounds the display area; forming a display unit on the display area of the lower substrate; forming, on the peripheral area of the lower substrate, a first metal layer including a plurality of first through-portions that extend in a first direction; forming, on the first metal layer, a first insulating film including a plurality of connection holes; forming, on the first insulating film, a second metal layer including a plurality of second through-portions that have sizes equal to or greater than sizes of the plurality of first through-portions; and placing the upper substrate on the lower substrate, forming a sealing member on the peripheral area of the lower substrate, and adhering the lower substrate and the upper substrate, wherein the forming of the second metal layer on the first insulating film includes filling a part of the second metal layer in the plurality of connection holes that are formed in the first insulating film and electrically connecting the first metal layer and the second metal layer.

The first insulating film may cover an opening portion of the lower substrate that is exposed through the plurality of first through-portions and the plurality of second through-portions, wherein a plurality of first fine holes are formed in the first insulating film on the opening portion.

The method may further include forming a second insulating film that covers the second metal layer, wherein the second insulating film covers an opening portion of the lower substrate that is exposed through the plurality of first through-portions and the plurality of second through-portions, wherein a plurality of second fine holes are formed in the second insulating film on the opening portion.

Another aspect is an organic light-emitting diode (OLED) display, comprising: a lower substrate comprising a display area and a peripheral area surrounding the display area; an upper substrate facing the lower substrate; a display unit disposed on the display area; a sealant disposed on the peripheral area and sealing the lower and upper substrates; a first metal layer interposed between the lower substrate and the sealant, wherein the first metal layer comprises a plurality of first through-portions extending in a first direction and arranged in a second direction crossing the first direction; a second metal layer disposed on the first metal layer and comprising a plurality of second through-portions respectively corresponding to the first through-portions, wherein each of the second through-portions has a size equal to or greater than the size of the respective first through-portion; and a plurality of connectors configured to electrically connect the first and second metal layers.

The above OLED display further comprises a barrier layer interposed between the lower substrate and the first metal layer, wherein the lower substrate or the barrier layer has an opening portion connected to the sealant through the first and second through-portions.

The above OLED display further comprises a first insulating film interposed between the first and second metal layers, wherein the first insulating film at least partially covers the opening portion and has a plurality of first fine holes formed in the opening portion.

In the above OLED display, at least a portion of the lower substrate or the barrier layer is connected to the sealant through the first fine holes.

In the above OLED display, the sealant is formed in the first fine holes.

The above OLED display further comprises a second insulating film disposed on the second metal layer, wherein the second insulating film at least partially covers the opening portion and has a plurality of second fine holes formed in the opening portion.

In the above OLED display, at least a portion of the lower substrate or the barrier layer is connected to the sealant through the second fine holes.

In the above OLED display, the sealant is formed in the second fine holes.

In the above OLED display, the second fine holes overlap the first fine holes in the depth dimension of the OLED display.

In the above OLED display, the second metal layer and the connectors are formed of the same material.

In the above OLED display, the first metal layer has an electric resistance that is greater than an electric resistance of the second metal layer.

In the above OLED display, the first and second through-portions have stripe shapes with a first side and a second side shorter than the first side, wherein the first and second through-portions extend in the first direction.

In the above OLED display, the first and second through-portions are alternately formed in the first direction and the second direction.

In the above OLED display, the lower substrate has a first edge and a second edge opposing the first edge, wherein each of the first and second metal layers has a first edge portion extending in the second direction along the first edge of the lower substrate, wherein each of the first and second metal layers has a second edge portion extending in the second direction along the second edge of the lower substrate, and wherein the connectors are formed along the first and second edge portion of the first and second metal layers.

In the above OLED display, the connectors are formed between the first and second through-portions.

In the above OLED display, the opening portion includes a plurality of opening portions, wherein the connectors are formed between the opening portions.

In the above OLED display, the display unit comprises a plurality of thin-film transistors (TFTs) each including a semiconductor layer, a gate electrode, a source electrode, and a drain electrode, wherein the first metal layer is disposed on the same layer as the gate electrode, and wherein the second metal layer is disposed on the same layer as the source and drain electrodes.

Another aspect is a method of manufacturing an organic light-emitting diode (OLED) display, the method comprising: preparing a lower substrate comprising a display area and a peripheral area surrounding the display area; forming a display unit on the display area; forming, on the peripheral area, a first metal layer comprising a plurality of first through-portions extending in a first direction; forming, on the first metal layer, a first insulating film comprising a plurality of connection holes; forming, on the first insulating film, a second metal layer comprising a plurality of second through-portions each having a size equal to or greater than the size of the corresponding first through-portion; placing the upper substrate on the lower substrate; forming a sealant on the peripheral area; and sealing the lower and upper substrates, wherein the forming of the second metal layer comprises filling the connection holes with a portion of the second metal layer so as to electrically connect the first and second metal layers.

In the above method, the lower substrate has an opening portion, the first insulating film at least partially covers the opening portion through the first and second through-portions, and a plurality of first fine holes are formed in the opening portion.

The above method further comprises forming a second insulating film covering the second metal layer, wherein the second insulating film has an opening portion, wherein the second insulating film at least partially covers the opening portion through the first and second through-portions, and wherein a plurality of second fine holes are formed in the opening portion.

The general and specific aspects may be implemented by using a system, a method, a computer program, or any combination of systems, methods, and computer programs.

DETAILED DESCRIPTION OF CERTAIN INVENTIVE EMBODIMENTS

Figure 1:
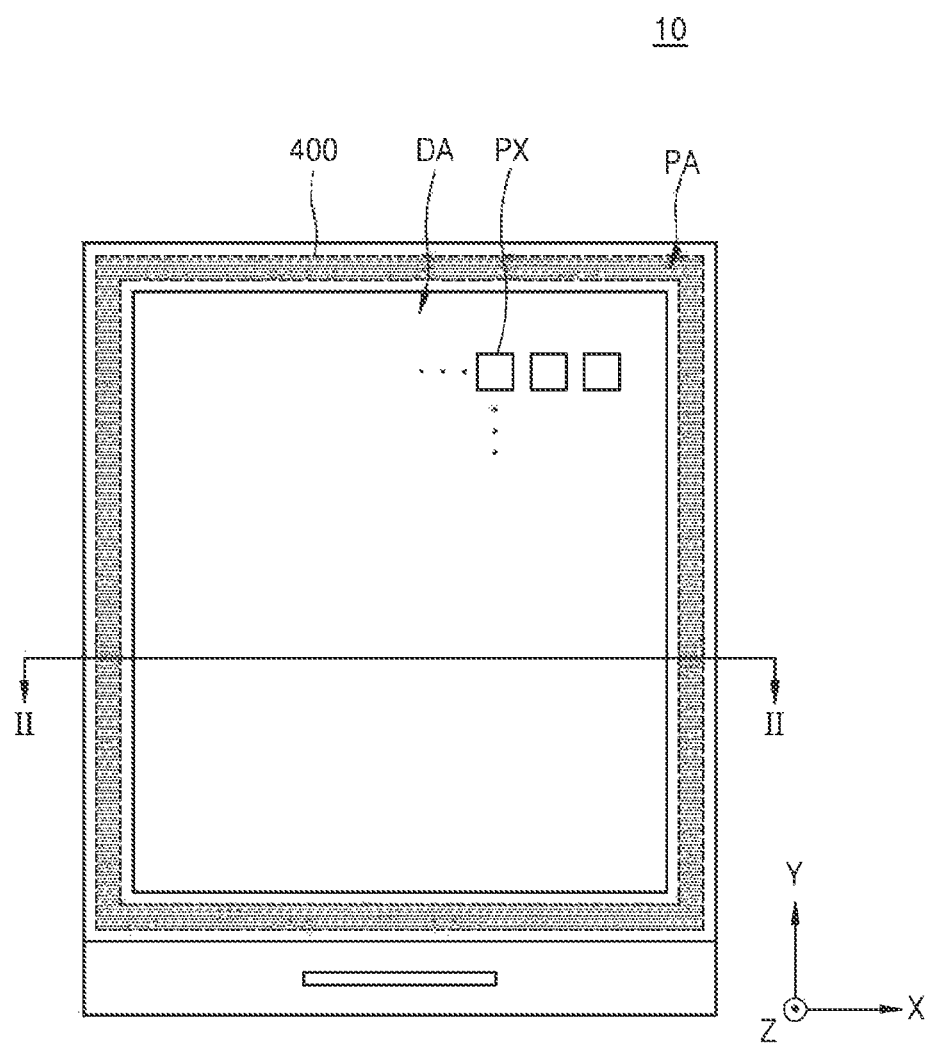
FIG. 1 is a plan view illustrating an OLED display according to an exemplary embodiment.

The described technology may include various embodiments and modifications, and exemplary embodiments thereof will be illustrated in the drawings and will be described herein in detail. The effects and features of the described technology and the accompanying methods thereof will become apparent from the following description of the embodiments, taken in conjunction with the accompanying drawings. However, the inventive concept is not limited to the embodiments described below, and may be embodied in various modes.

It will be understood that although the terms "first", "second", etc. may be used herein to describe various elements, these elements should not be limited by these terms. These elements are only used to distinguish one element from another. As used herein, the singular forms "a", "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

Sizes of elements may be exaggerated for convenience of explanation. In other words, since sizes and thicknesses of elements in the drawings are arbitrarily illustrated for convenience of explanation, the following exemplary embodiments are not limited thereto. When a certain embodiment may be implemented differently, a specific process order may be performed differently from the described order. For example, two consecutively described processes may be performed substantially at the same time or performed in an order opposite to the described order.

Reference will now be made in detail to exemplary embodiments, examples of which are illustrated in the accompanying drawings. In the drawings, the same elements are denoted by the same reference numerals, and a repeated explanation thereof will not be given.

As used herein, the term "and/or" includes any and all combinations of one or more of the associated listed items. Expressions such as "at least one of" when preceding a list of elements, modify the entire list of elements and do not modify the individual elements of the list. In this disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

Figure 2:
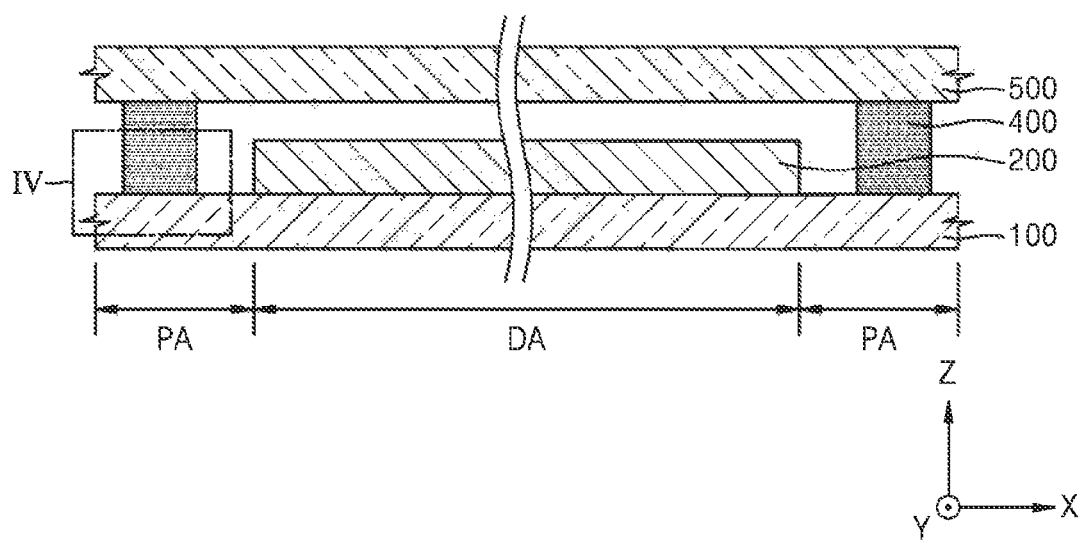
FIG. 2 is a cross-sectional view taken along line II-II of the OLED display of FIG. 1.

FIG. 1 is a plan view illustrating an OLED display 10 according to an exemplary embodiment. FIG. 2 is a cross-sectional view taken along line II-II of the OLED display of FIG. 1.

Referring to FIGS. 1 and 2, the OLED display 10 according to an exemplary embodiment includes a lower substrate 100, a display unit 200 that is disposed on the lower substrate 100, a sealing member (or sealant) 400, and an upper substrate 500 that is adhered to the lower substrate 100 by using the sealing member 400.

The lower substrate 100 may be formed of any of various materials such as a glass material, a metal material, or a plastic material (e.g., polyethylene terephthalate (PET), polyethylene naphthalate (PEN), or polyimide). The lower substrate 100 may include a display area DA on which the display unit 200 including a plurality of pixels is disposed and a peripheral area PA that surrounds the display area DA.

The upper substrate 500 may be formed of any of various materials such as a glass material, a metal material, or a plastic material (e.g., PET, PEN, or polyimide), like the lower substrate 100. The lower substrate 100 and the upper substrate 500 may be formed of the same material or different materials.

The sealing member 400 may be disposed between the lower substrate 100 and the upper substrate 500. The sealing member 400 may be disposed on the peripheral area PA of the lower substrate 100, and may seal the upper substrate 500 and the lower substrate 100 by adhering the upper substrate 500 to the lower substrate 100. For example, the sealing member 400 includes, but is not limited to, frit or epoxy.

The display unit 200 may be disposed on the display area DA of the lower substrate 100 and may include the pixels. For example, the display unit 200 is a liquid crystal display (LCD) or an OLED display unit including a plurality of thin-film transistors (TFTs) and pixel electrodes that are connected to the TFTs. The present exemplary embodiment will be explained on the assumption that the display unit 200 is an OLED display unit. The structure of the display unit 200 will now be explained in detail with reference to FIG. 3.

Figure 3:
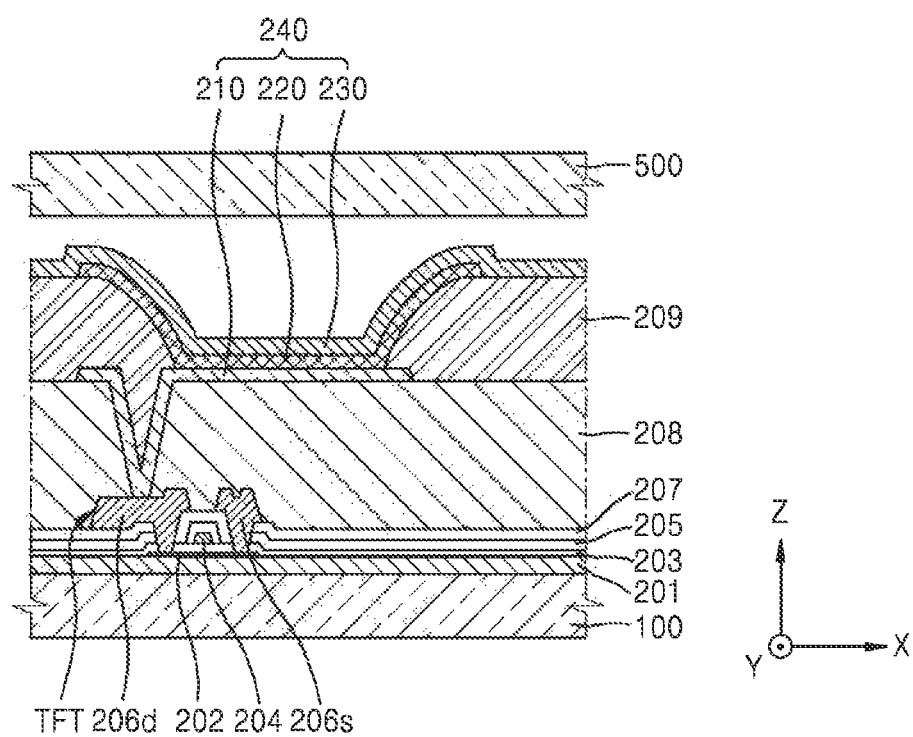
FIG. 3 is a cross-sectional view illustrating a structure of the pixel unit of FIG. 1.

FIG. 3 is a cross-sectional view illustrating a structure of a pixel unit PX of FIG. 1.

Referring to FIG. 3, the display unit 200 includes a TFT, a capacitor (not shown), and an OLED 240 that is electrically connected to the TFT. The TFT may include a semiconductor layer 202 that is formed of amorphous silicon, polycrystalline silicon, or an organic semiconductor material. The TFT also includes a gate electrode 204, a source electrode 206s, and a drain electrode 206d.

In order to planarize a surface of the lower substrate 100 or to prevent impurities from penetrating into the semiconductor layer 202 of the TFT, a barrier layer 201 formed of silicon oxide or silicon nitride may be disposed on the lower substrate 100 and the semiconductor layer 202 may be disposed on the barrier layer 201.

The gate electrode 204 is disposed over the semiconductor layer 202. The source electrode 206s and the drain electrode 206d are electrically connected to each other according to a signal applied to the gate electrode 204. By taking into account adhesion with an adjacent layer, surface flatness of a stacked layer, and processability, the gate electrode layer 204 may have a single-layer structure or a multi-layer structure formed of at least one material selected from, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

In this case, in order to ensure insulation between the semiconductor layer 202 and the gate electrode 204, a gate insulating film 203 formed of silicon oxide and/or silicon nitride may be disposed between the semiconductor layer 202 and the gate electrode 204.

Insulating films may be formed over the gate electrode 204 to have a single-layer structure or a multi-layer structure formed of silicon oxide or silicon nitride. When the insulating films have a multi-layer structure, the insulating films may include a first insulating film 205 and a second insulating film 207.

Although not shown in FIG. 3, when the insulating films have a multi-layer structure, a conductive layer (not shown) that partially overlaps the gate electrode 204 may be further provided over the gate electrode 204 according to a structure of a backplane layer including a TFT.

The conductive layer may be formed between the first insulating film 205 and the second insulating film 207. In this case, the first insulating film 205 may function as an insulating film that insulates the gate electrode 204 and the conductive layer from each other. A portion of the conductive layer that overlaps the gate electrode 204 may function as a capacitor. That is, the gate electrode 204 that is disposed under the conductive layer may be a lower electrode of the capacitor and the conductive layer that is disposed over the gate electrode 204 may function as an upper electrode of the capacitor. In this case, the first insulating film 205 may function as a dielectric film.

When the conductive layer is not formed, a second metal layer 320 (see FIG. 4) may be disposed only between the first insulating film 205 and the second insulating film 207.

The source electrode 206s and the drain electrode 206d are disposed on the first and second insulating films 205 and 207. The source electrode 206s and the drain electrode 206d are electrically connected to the semiconductor layer 202 through a contact hole that is formed in the first and second insulating films 205 and 207 and the gate insulating film 203. By taking into account conductivity or the like, each of the source electrode 206s and the drain electrode 206d may be formed to have a single-layer structure or a multi-layer structure formed of at least one material selected from, for example, Al, Pt, Pd, Ag, Mg, Au, Ni, Nd, Ir, Cr, Li, Ca, Mo, Ti, W, and Cu.

A third insulating film 208 may be disposed on the lower substrate 100. In this case, the third insulating film 208 may be a planarization film. When the OLED 240 is disposed over the TFT, the third insulating film 208 may substantially planarize a top surface of the TFT and may protect the TFT and various devices. The third insulating film 208 may be formed of, for example, an acrylic organic material or benzocyclobutene (BCB). In this case, as shown in FIG. 3, the barrier layer 201, the gate insulating film 203, and the first and second insulating films 205 and 207 may be formed over the entire surface of the lower substrate 100.

A fourth insulating film 209 may be disposed over the TFT. In this case, the fourth insulating film 209 may be a pixel-defining film. The fourth insulating film 209 may be disposed on the third insulating film 208, and may have an opening through which a central portion of a pixel electrode 210 is exposed. The fourth insulating film 209 defines a pixel region.

The fourth insulating film 209 may be, for example, an organic insulating film. The organic insulating film may be formed of an acrylic polymer such as polymethylmethacrylate (PMMA), polystyrene (PS), a polymer derivative having a phenol group, an imide-based polymer, an arylether-based polymer, an amide-based polymer, a fluorine-based polymer, a p-xylene-based polymer, a vinyl alcohol-based polymer, or a combination thereof.

The OLED 240 may be disposed on the third insulating film 208. The OLED 240 may include the pixel electrode 210, an intermediate layer 220 including an emission layer EML, and a counter electrode 230.

The pixel electrode 210 may be a (semi)transparent electrode or a reflective electrode. When the pixel electrode 210 is a (semi)transparent electrode, the pixel electrode 210 may be formed of, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 210 is a reflective electrode, the pixel electrode 210 may include a reflective film formed Ag, Mg, Al, Pt, Pd, Au, Ni, Nd, Ir, Cr, or a compound thereof and a layer formed of ITO, IZO, ZnO, $In_2O_3$, IGO, or AZO. However, the described technology is not limited thereto, and the pixel electrode 210 may be formed of any of various materials and may have any of various structures such as a single-layer structure or a multi-layer structure.

The intermediate layer 220 may be disposed in the pixel region that is defined by the fourth insulating film 209. The intermediate layer 220 may include the emission layer EML that emits light in response to an electrical signal, and may further include a hole injection layer (HIL) and a hole transport layer (HTL) that are disposed between the emission layer EML and the pixel electrode 210 and an electron transport layer (ETL) and an electron injection layer (EIL) that are disposed between the emission layer EML and the counter electrode 230 to have a single-layer structure or a multi-layer structure. However, the intermediate layer 220 is not limited thereto, and may have any of other various structures.

The counter electrode 230 that covers the intermediate layer 220 including the emission layer EML and faces the pixel electrode 210 may be disposed over the entire surface of the lower substrate 100. The counter electrode 230 may be a (semi)transparent electrode or a reflective electrode.

When the counter electrode 230 is a (semi)transparent electrode, the counter electrode 230 may include a layer formed of a metal having a low work function such as Li, Ca, LiF/Ca, LiF/Al, Al, Ag, Mg, or a compound thereof and a (semi)transparent conductive layer including ITO, IZO, ZnO, or $In_2O_3$. When the counter electrode 230 is a reflective electrode, the counter electrode 230 may include a layer formed of Li, Ca, LiF/Ca, LiF/Al, Al, Ag, Mg, or a compound thereof. However, the configuration and the material of the counter electrode 230 are not limited thereto, and various modifications may be made.

Figure 4:
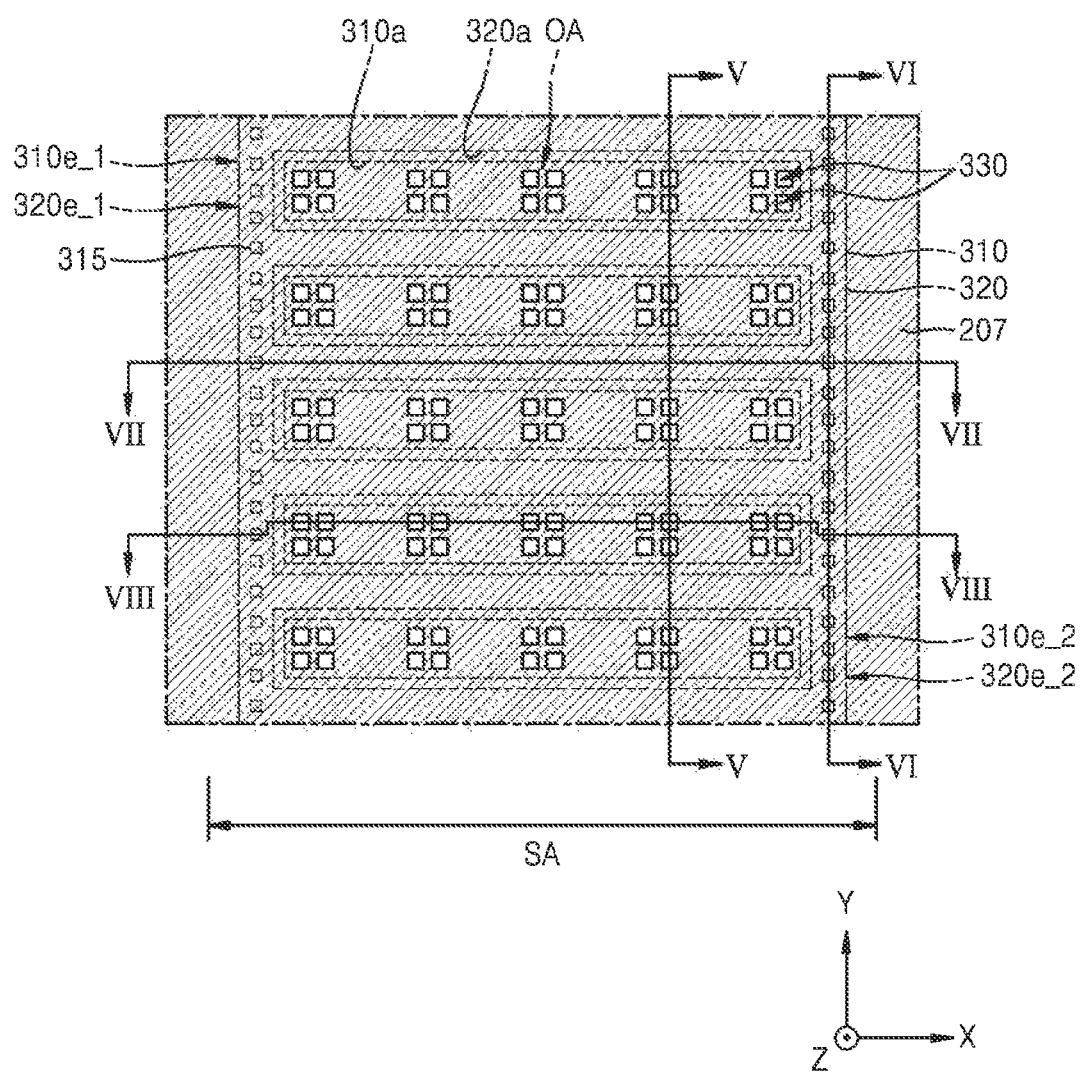
FIG. 4 is an enlarged plan view illustrating a region IV of FIG. 2.

FIG. 4 is an enlarged plan view illustrating a region IV of FIG. 2.

For convenience of explanation, the sealing member 400 is not shown in FIG. 4. However, the sealing member 400 may be disposed over a structure of FIG. 4. The sealing member 400 may be formed on a sealing area SA.

Referring to FIG. 4, a first metal layer 310 is disposed on the peripheral area PA of the lower substrate 100, and is disposed between the lower substrate 100 and the sealing member 400. The first metal layer 310 may include a plurality of first through-portions 310a. The first through-portions 310a may extend in a first direction (e.g., an X-axis direction), as shown in FIG. 4. That is, the first through-portions 310a may be formed to have stripe shapes with long sides and short sides and to be parallel to one another in a second direction (e.g., a Y-axis direction).

A second metal layer 320 may be further disposed on the first metal layer 310, and may be disposed between the first metal layer 310 and the sealing member 400. The second metal layer 320 may include a plurality of second through-portions 320a. The second through-portions 320a may extend in the first direction (e.g., the X-axis direction), like the first through-portions 310a. Accordingly, the second through-portions 320a may also be formed to have stripe shapes with long sides and short sides and to be parallel to one another in the second direction (a Y-axis direction). The second through-portions 320a may be formed to correspond in position to the first through-portions 310a and to have sizes that are substantially equal to or greater than those of the first through-portions 310a. As such, the second metal layer 320 may be formed over the first metal layer 310.

An opening portion OA, on which at least a part of the lower substrate 100 or the barrier layer 201 is exposed through the first through-portions 310a of the first metal layer 310 and the second through-portions 320a of the second layer 320, may be formed. Although the opening portion OA exposes at least a part of the lower substrate 100 in FIG. 4, exemplary embodiments are not limited thereto. That is, as described above, the opening portion OA may expose the barrier layer 201 that is formed on the lower substrate 100.

The first insulating film 205 may be disposed between the first metal layer 310 and the second metal layer 320, and the second insulating film 207 may be disposed between the second metal layer 320 and the sealing member 400. The first insulating film 205 and the second insulating film 207 may extend from the display area DA to the peripheral area PA, as described above with reference to FIG. 3.

In FIG. 4, the second insulating film 207 is disposed on the second metal layer 320. The second insulating film 207 may be formed to cover a part of the opening portion OA. A plurality of fine holes 330 may be formed in the second insulating film 207 that is formed on the opening portion OA, and a part of the lower substrate 100 may be exposed through the plurality of fine holes 330.

The first metal layer 310 and the second metal layer 320 may be electrically connected to each other by using a connecting portion (or connector) 315. The connecting portion 315 may include the same material as that of the second metal layer 320. A plurality of the connecting portions 315 may be formed along first edge portions 310e_1 and 320e_1 that extend in the second direction (e.g., the Y-axis direction) along an edge of the lower substrate 100 and along second edge portions 310e_2 and 320e_2 that extend in the second direction (e.g., the Y-axis direction) from the display unit 200, unlike the first edge portions 310e_1 and 320e_1. The connecting portions 315 will be explained below in detail with reference to FIGS. 6 through 8.

Figure 5:
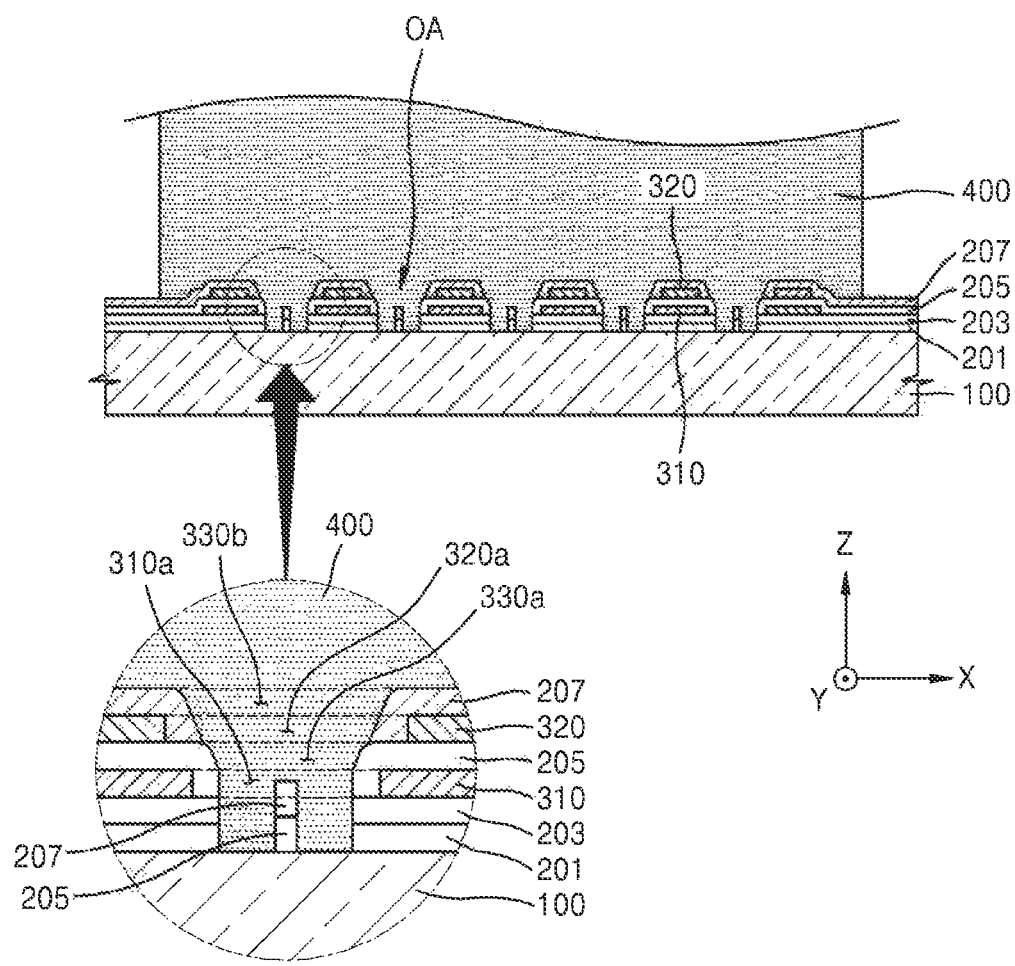
FIG. 5 is a cross-sectional view taken along line V-V of FIG. 4.

FIG. 5 is a cross-sectional view taken along line V-V of FIG. 4.

Referring to FIGS. 4 and 5, the barrier layer 201 is formed on the lower substrate 100 and the gate insulating film 203 may be formed on the barrier layer 201. The barrier layer 201 and the gate insulating film 203 may extend from the display area DA to the peripheral area PA to be formed over the entire surface of the lower substrate 100.

The first metal layer 310 may be disposed on the gate insulating film 203. The first metal layer 310 may include the first through-portions 310a for forming the opening portion OA. When the first through-portions 310a are formed in the first metal layer 310, parts of the barrier layer 201 and the gate insulating film 203 that are disposed under the first metal layer 310 may be removed. In this process, the first through-portions 310a of the first metal layer 310 may form the opening portion OA through which a part of the lower substrate 100 is exposed. A plurality of fine holes that are formed by the first insulating film 205 and the second insulating film 207 may be formed in the opening portion OA. In this case, the fine holes 330 may include a plurality of first fine holes 330a that are formed in the first insulating film 205 and a plurality of second fine holes 330b that are formed in the second insulating film 207.

The first insulating film 205 may be disposed on the first metal layer 310 to be formed over the entire surface of the lower substrate 100. The first insulating film 205 may also be formed on the opening portion OA to cover at least a part of the opening portion OA. The first insulating film 205 that is formed on the opening portion OA may include the first fine holes 330a. In the present exemplary embodiment, a part of the lower substrate 100 may be exposed through the first fine holes 330a. According to another exemplary embodiment, a part of the barrier layer 201 may be exposed.

Next, the second metal layer 320 may be disposed on the first insulating film 205. The second metal layer 320 may include the second through-holes 320a. The second through-holes 320a that are formed in the second metal layer 320 may be formed to correspond in position to the first through-portions 310a that are formed in the first metal layer 310, and to have sizes that are substantially equal to or greater than those of the first through-portions 310a. Accordingly, the opening portion OA, on which a part of the lower substrate 100 is exposed through the second through-portions 320a, may be formed.

Also, the second insulating film 207 may be disposed on the second metal layer 320 to be formed over the entire surface of the lower substrate 100. The second insulating film 207 may also be formed on the opening portion OA to cover at least a part of the opening portion OA. A portion of the second insulating film 207 that is formed on the opening portion OA may include the second fine holes 330b. The second fine holes 330b may be formed to correspond in position to the first fine holes 330a. Accordingly, a part of the lower substrate 100 may be exposed through the second fine holes 330b, and a part of the barrier layer 201 may be exposed according to another exemplary embodiment.

The sealing member 400 may be filled in the first fine holes 330a and the second fine holes 330b. A contact area between the sealing member 400 and the lower substrate 100 may be increased due to the first fine holes 330a and the second fine holes 330b. For example, as the first through-portions 310a and the second through-portions 320a continuously extend, an area where the fine holes 300 may be formed may be maximized, a contact area between the sealing member 400 and the lower substrate 100 may be maximized, and an adhesive force between the sealing member 400 and the lower substrate 100 may be greatly increased.

Figure 6:
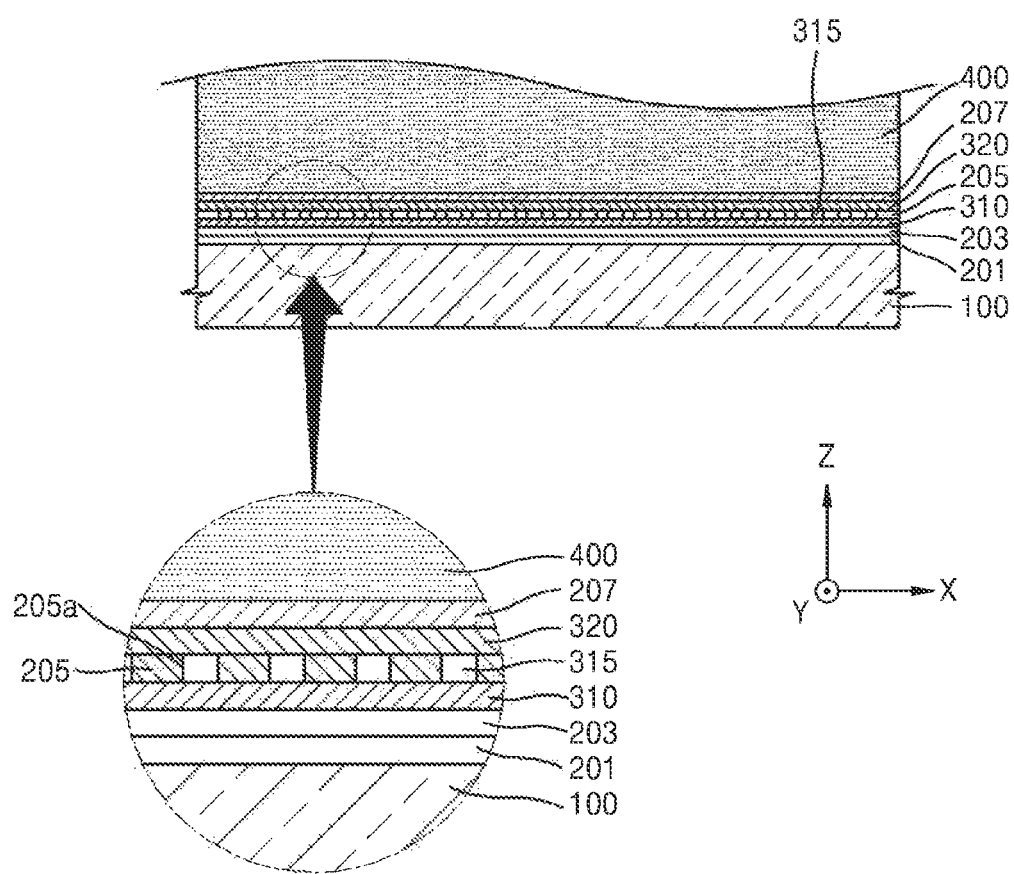
FIG. 6 is a cross-sectional view taken along line VI-VI of FIG. 4.

FIG. 6 is a cross-sectional view taken along line VI-VI of FIG. 4.

FIG. 6 is a cross-sectional view obtained by cutting a part of the sealing area SA to show cut-surfaces of the plurality of connecting portions 315 that are formed along the second edge portions 310e_2 and 320e_2 on which the first through portions 310a and the second through-portions 320 are not formed.

Referring to FIG. 6, the barrier layer 201, the gate insulating film 203, the first metal layer 310 that is formed on the gate insulating film 203, the first insulating film 205, the second metal layer 320, and the second insulating film 207 may be sequentially formed on the lower substrate 100 as described above.

A connection hole 205a may be formed in the first insulating film 205 that is disposed between the first metal layer 310 and the second metal layer 320, and the connecting portions 315 formed of the same material as that of the second metal layer 320 may be formed in the connection hole 205a.

The connecting portions 315 are elements that electrically connect the first metal layer 310 to the second metal layer 320 as described above. In general, the first metal layer 310 may be disposed on the same layer as the gate electrode 204, and the second metal layer 320 may be disposed on a same layer (e.g., the first insulating film 205) as the source electrode 206s and the drain electrode 206d. That is, the first metal layer 310 may be formed when the gate electrode 204 is formed on the barrier layer 201 and the gate insulating film 203, and the second metal layer 320 may be formed when the source electrode 206s and the drain electrode 206d are formed on the barrier layer 201 and the gate insulating film 203. Also, the first metal layer 310 may be formed of the same material as that of the gate electrode 204, and the second metal layer 320 may be formed of the same material as that of the source electrode 206s and the drain electrode 206d.

Accordingly, the connecting portions 315 may be formed when the same conductive material as that of the second metal layer 320 is filled in the connection hole 205a that is formed in the first insulating film 205 to form the source electrode 206s and the drain electrode 206d on the second insulating film 207, that is, to form the second metal layer 320 on the first insulating film 205.

In general, when static electricity is introduced from the outside into the OLED display and is accumulated on the first metal layer 310 that is disposed on the peripheral area PA, poor adhesion between the lower substrate 100 and the sealing member 400 may occur or a circuit unit that is connected to the second edge portions 310e_2 and 320e_2 may be damaged. Furthermore, since the first metal layer 310 is formed of the same material as that of the gate electrode 204 having an electric resistance that is greater than that of the second metal layer 320 that has the same physical property as that of the source electrode 206s or the drain electrode 206d, the accumulated static electricity may not be efficiently dissipated and electrostatic charges may be accumulated on the first metal layer 310.

The second metal layer 320 may be formed of a material having an electric resistance that is less than that of the first metal layer 310. For example, the first metal layer 310 includes a material having an electric resistance that is about 10 times greater than that of the second metal layer 320. Accordingly, when the connecting portions 315 that electrically connect the first metal layer 310 to the second metal layer 320 are provided, electrostatic charges accumulated on the first metal layer 310 may be efficiently dissipated through the second metal layer 320 and electrostatic charges that are introduced from the outside may be prevented from being introduced into the circuit.

Figure 7:
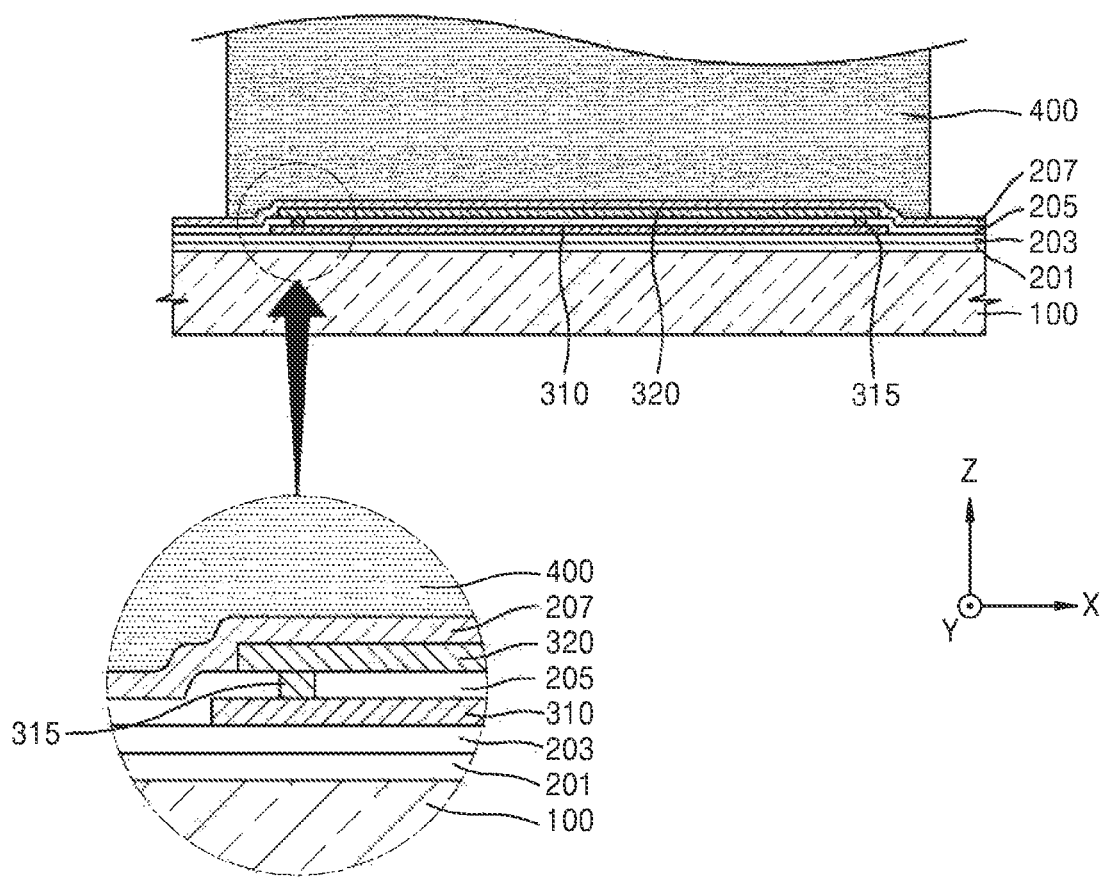
FIG. 7 is a cross-sectional view taken along line VII-VII of FIG. 4.

FIG. 7 is a cross-sectional view taken along line VII-VII of FIG. 4.

In FIG. 7, the connecting portions 315 are formed along the first edge portions 310e_1 and 320e_1 and the second edge portions 310e_2 and 320e_2.

Referring to FIGS. 4 and 7, the barrier layer 201 is formed on the lower substrate 100 and the gate insulating film 203 is formed on the barrier layer 201. The barrier layer 201 and the gate insulating film 203 may extend from the display area DA to the peripheral area PA to be formed over the entire surface of the lower substrate 100.

The first through-portions 310a and the second through-portions 320a may extend in the first direction (e.g., the X-axis direction) and may be spaced apart from each other in the second direction (e.g., the Y-axis direction). As such, the first metal layer 310 and the second metal layer 320 may be continuously arranged on an area where the first through-portions 310a and the second through-portions 320a are spaced apart from each other.

Figure 8:
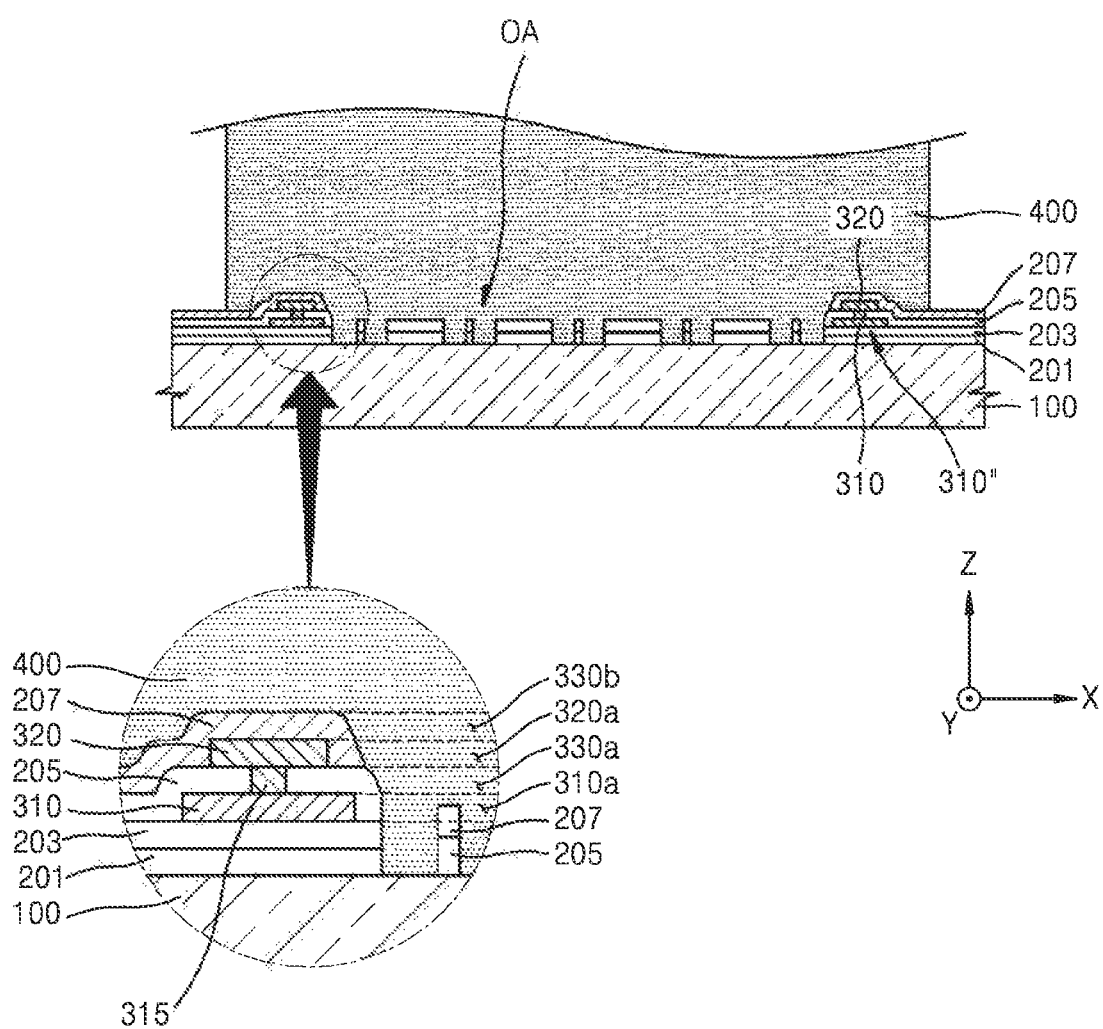
FIG. 8 is a cross-sectional view taken along line VIII-VIII of FIG. 4.

FIG. 8 is a cross-sectional view taken along line VIII-VIII of FIG. 4.

FIG. 8 is a cross-sectional view taken in the first direction (e.g., the X-axis direction) in which the first through-portions 310a and the second through-portions 320a are disposed. The first insulating film 205 and the second insulating film 207 may be formed on the opening portion OA on which the first through-portions 310a and the second through-portions 320a are formed. The first fine holes 330a and the second fine holes 330b may be respectively formed in the first insulating film 205 and the second insulating film 207 that are disposed on the opening portion OA. A part of the lower substrate 100 may be exposed through the first fine holes 330a, the second fine holes 330b, the first through-portions 310a, and the second through-holes 320a.

The first metal layer 310 may include the first edge portion 310e_1 that extends along an edge of the lower substrate 100 and the second edge portion 310e_2 that extends from the display unit 200. The second metal layer 320 that is formed on the first metal layer 310 may include the first edge portion 320e_1 that extends along the edge of the lower substrate 100 and the second edge portion 320e_2 that extends from the display unit 200, like the first meal layer 310.

The first edge portions 310e_1 and 320e_1 and the second edge portions 310e_2 and 320e_2 of the first metal layer 310 and the second metal layer 320 may continuously extend in the second direction (e.g., the Y-axis direction) that is perpendicular to (or crossing) the first direction (e.g., the X-axis direction) in which the first through-portions 310a and the second through-portions 320a are formed.

Accordingly, as shown in FIG. 8, the first metal layer 310 and the second metal layer 320 may be disposed on the first edge portions 310e_1 and 320e_1 and the second edge portions 310e_2 and 320e_2. The first metal layer 310 and the second metal layer 320 that overlap the first edge portions 310e_1 and 320e_1 and the second edge portions 310e_2 and 320e_2 may form a cap and may prevent static electricity from being introduced into the display unit 200. Also, the first metal layer 310 and the second metal layer 320 that overlap the first edge portions 310e_1 and 320e_1 and the second edge portions 310e_2 and 320e_2 may form a protrusion having a predetermined height and may prevent the sealing member 400 from flowing to the outside of the sealing area SA.

Figure 9:
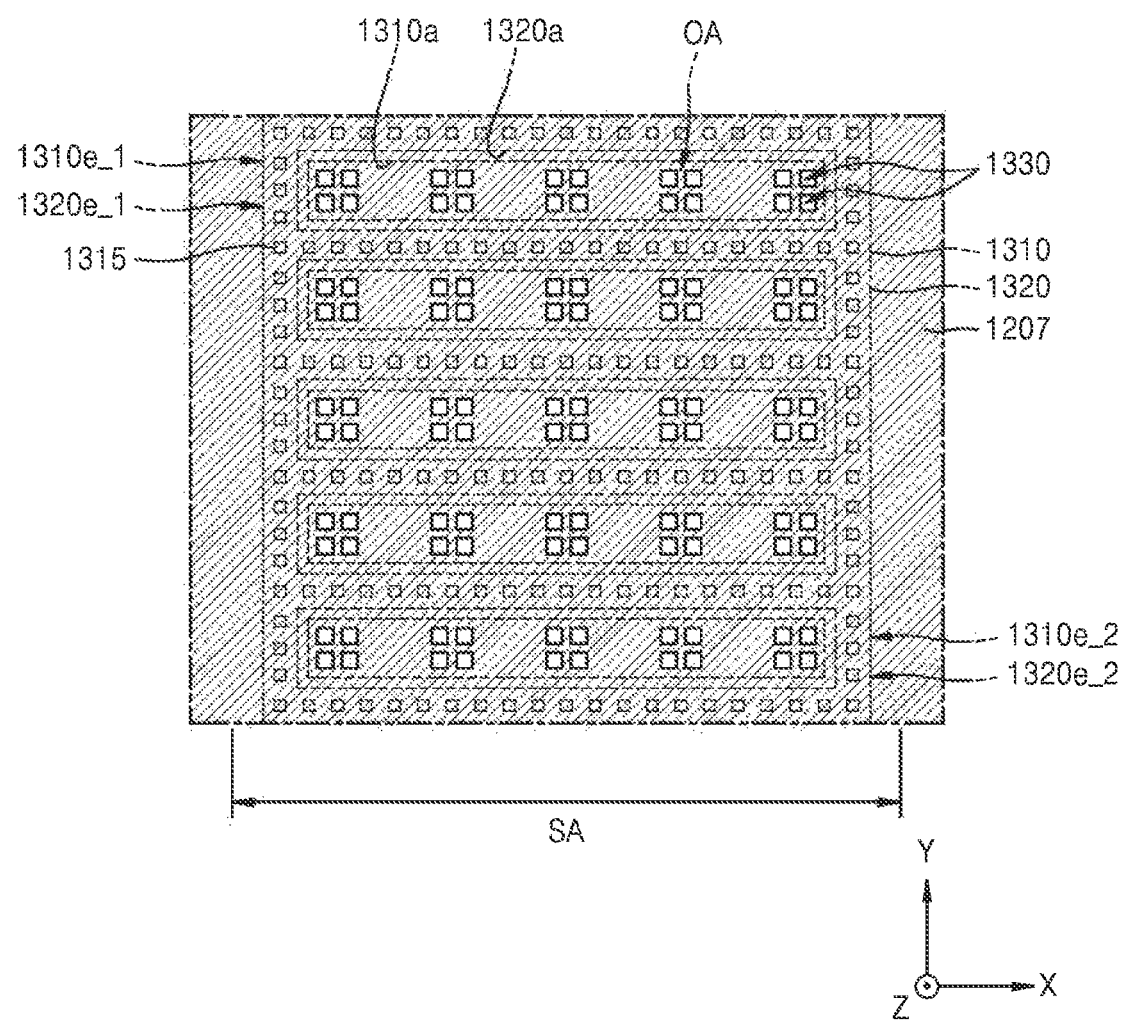
FIG. 9 is a plan view illustrating the region IV of FIG. 2 according to another exemplary embodiment.

FIG. 9 is a plan view illustrating the region IV of FIG. 2 according to another exemplary embodiment.

Referring to FIG. 9, a plurality of connecting portions (or connectors) 1315 are formed along first edge portions 1310e_1 and 1320e_1 and second edge portions 1310e_2 and 1320e_2 as shown in FIG. 4, and are also formed between first through-portions 1310a and second through-portions 1320a.

Figure 10:
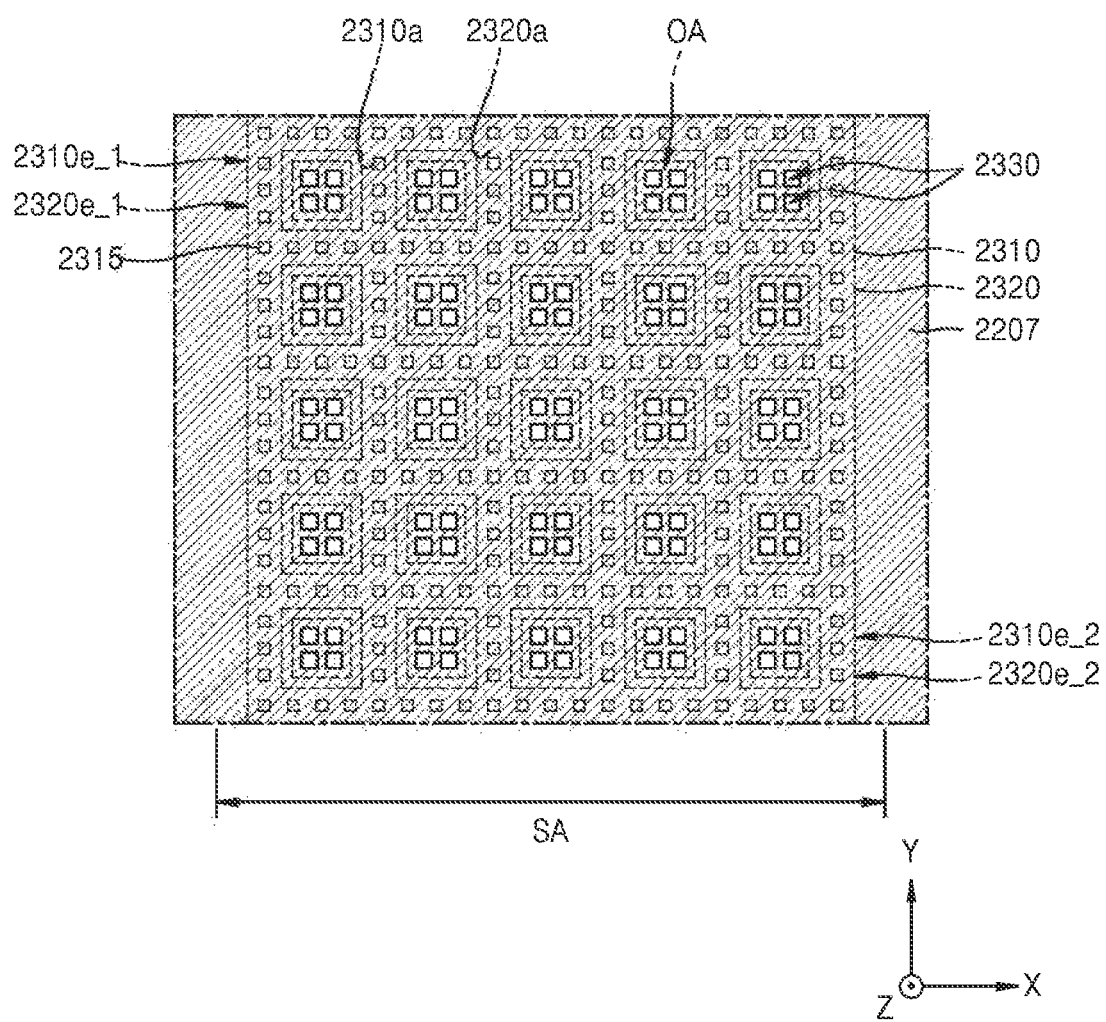
FIG. 10 is a plan view illustrating the region IV of FIG. 2 according to another exemplary embodiment.

FIG. 10 is a plan view the region IV of FIG. 2 according to another exemplary embodiment.

Referring to FIG. 10, a plurality of connecting portions (or connectors) 2315 may be formed along first edge portions 2310e_1 and 2320e_1 and second edge portions 2310e_2 and 2320e_2 as shown in FIG. 4, between first through-portions 2310a and second through-portions 2320a as shown in FIG. 9, and between the opening portions OA.

Even in this case, the first through-portions 2310a and the second through-portions 2320a may be formed close to the opening portions OA, and a first metal layer 2310 and a second metal layer 2320 may be formed between the opening portions OA. That is, the connecting portions 2315 may be formed both in the second direction (e.g., the Y-axis direction) in which the first edge portions 2310e_1 and 2320e_1 and the second edge portions 2310e_2 and 2320e_2 extend and in the first direction (e.g., the X-axis direction) that is substantially perpendicular to (or crossing) the second direction.

FIGS. 9 and 10 exemplarily illustrate that the connecting portions 315, 1315, and 2315 may be formed at any of various positions on the peripheral area PA of the OLED display. That is, the connecting portions 315, 1315, and 2315 may be formed at any position as long as they may electrically connect the first metal layers 1310 and 2310 to the second metal layers 1320 and 2320 that have electrical resistances that are less than those of the first metal layers 1310 and 2310.

In this configuration, since electrostatic charges that are introduced from the outside may not be accumulated on the first metal layers 310, 1310, and 2310 and may be respectively transmitted to the second metal layers 320, 1320, and 2320, local electrostatic charge concentration may be avoided, poor adhesion between the lower substrate 100 and the sealing member 400 may be avoided, and electrostatic charges may be prevented from being introduced into the display unit 200.

According to at least one of the disclosed embodiments, an OLED display and a method of manufacturing the same may prevent damage to a display unit and poor adhesion between a lower substrate and a sealing member by rapidly dissipating static electricity that is introduced from the outside.

It will be understood that the spirit and scope of the described technology is not limited by these effects.

While the inventive technology has been described with reference to the figures, it will be understood by those of ordinary skill in the art that various changes in form and details may be made therein without departing from the spirit and scope as defined by the following claims.

What is claimed is:

1. An organic light emitting diode (OLED) display, comprising:
    a substrate;
    a display unit on the substrate;
    a first metal layer on the substrate;
    an insulating layer on the first metal layer;
    a second metal layer on the insulating layer; and
    a sealant on the second metal layer,
    wherein the first metal layer has a plurality of first openings arranged in a first direction,
    wherein the insulating layer has a plurality of second openings corresponding to the plurality of first openings and a plurality of third openings arranged in the first direction,
    wherein the plurality of third openings is filled with the second metal layer and is located between the display unit and the plurality of first openings,
    wherein a first width of the plurality of first openings in the first direction is greater than a second width of the plurality of third openings in the first direction, and
    wherein one of the plurality of third openings is located between adjacent first openings of the plurality of first openings.

2. The OLED display of claim 1, wherein at least a portion of the first metal layer and at least a portion of the second metal layer overlap each other.

3. The OLED display of claim 1, wherein at least one of the first metal layer and the second metal layer and the sealant overlap each other.

4. The OLED display of claim 1, wherein the second metal layer has a fourth opening.

5. The OLED display of claim 1, wherein the sealant is in one of the plurality of first openings and one of the plurality of second openings corresponding to the one of the plurality of first openings.

6. The OLED display of claim 5, further comprising:
    a gate insulating layer between the substrate and the first metal layer.

7. The OLED display of claim 6, wherein the gate insulating layer has a fifth opening corresponding to one of the plurality of first openings and one of the plurality of second openings.

8. The OLED display of claim 7, wherein the sealant is in one of the plurality of first openings, one of the plurality of second openings, and the fifth opening.

9. The OLED display of claim 8, wherein the sealant is in direct contact with the substrate.

10. The OLED display of claim 1, wherein a width of one of the plurality of first openings is greater than a width of the sealant located in one of the plurality of first openings.

11. The OLED display of claim 1, wherein a portion of the insulating layer is located in one of the plurality of first openings.

12. The OLED display of claim 1, wherein the insulating layer comprises a plurality of insulating layers.

13. The OLED display of claim 1, wherein one of the plurality of third openings is located between adjacent first openings of the plurality of first openings in a plan view.

14. The OLED display of claim 1, wherein one of the plurality of third openings overlaps an edge portion of the first metal layer in a plan view.

15. An organic light emitting diode display, comprising:
    a substrate;
    a display unit on the substrate;
    a first metal layer on the substrate;
    an insulating layer on the first metal layer;
    a second metal layer on the insulating layer; and a sealant on the second metal layer, wherein the first metal layer has a plurality of first openings arranged in a first direction, wherein the insulating layer has a plurality of second openings corresponding to the plurality of first openings and a plurality of third openings arranged in the first direction, wherein the plurality of third openings is filled with the second metal layer and is located between the display unit and the plurality of first openings, wherein a first width of the plurality of first openings in the first direction is greater than a second width of the plurality of third openings in the first direction, and wherein each of the plurality of third openings is located between at least two of the plurality of first openings.

* * * * *